(12) United States Patent
Huang et al.

(10) Patent No.: US 9,035,317 B2
(45) Date of Patent: May 19, 2015

(54) PIXEL STRUCTURE, DISPLAY PANEL AND METHOD FOR FABRICATING PIXEL STRUCTURE

(71) Applicant: Au Optronics Corporation, Hsinchu (TW)

(72) Inventors: Shu-Ming Huang, Miaoli County (TW); Yi-Ji Tsai, Hsinchu (TW); Chung-Li Chao, New Taipei (TW); Wan-Jung Tseng, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/016,207

(22) Filed: Sep. 2, 2013

(65) Prior Publication Data
US 2014/0339563 A1    Nov. 20, 2014

(30) Foreign Application Priority Data

May 20, 2013   (TW) .............................. 102117793 A

(51) Int. Cl.
*H01L 29/00* (2006.01)
*H01L 21/77* (2006.01)

(52) U.S. Cl.
CPC ..................................... *H01L 21/77* (2013.01)

(58) Field of Classification Search
CPC ............ H01L 27/124; H01L 27/14603; H01L 27/14609
USPC .............................................. 257/72, E27.141
See application file for complete search history.

(56) References Cited

U.S. PATENT DOCUMENTS

| 7,251,005 | B2 | 7/2007 | Ono et al. |
| 7,663,724 | B2 | 2/2010 | Lim et al. |
| 2005/0078261 | A1 | 4/2005 | Ono et al. |
| 2011/0310341 | A1 | 12/2011 | Kim et al. |

*Primary Examiner* — Elias M Ullah
(74) *Attorney, Agent, or Firm* — Jianq Chyun IP Office

(57) ABSTRACT

A pixel structure disposed on a substrate is provided. The pixel structure includes a gate electrode, a first gate insulation layer, a pixel electrode, a second gate insulation layer, a channel layer, a source electrode, a drain electrode and a common electrode. The gate electrode is disposed on the substrate and covered by the first gate insulation layer. The pixel electrode is disposed on the first gate insulation layer and covered by the second gate insulation layer. The pixel electrode is located between the first and the second gate insulation layers. The second gate insulation layer has a first contact opening exposing a portion of the pixel electrode. The channel layer is disposed on the second gate insulation layer. The drain electrode electrically connected to the pixel electrode. The source electrode is disposed on the second gate insulation layer. The common electrode is disposed on the second gate insulation layer.

20 Claims, 6 Drawing Sheets

PIXEL STRUCTURE, DISPLAY PANEL AND METHOD FOR FABRICATING PIXEL STRUCTURE

CROSS-REFERENCE TO RELATED APPLICATION

This application claims the priority benefit of Taiwan application serial no. 102117793, filed on May 20, 2013. The entirety of the above-mentioned patent application is hereby incorporated by reference herein and made a part of this specification.

BACKGROUND

1. Field of the Invention

The present invention relates to a pixel structure, a display panel and a method for fabricating the pixel structure. More particularly, the present invention relates to a pixel structure with good reliability, a display panel having the pixel structure and a method for fabricating the pixel structure.

2. Description of Related Art

Display panels may be mainly categorized into types as follows, organic electroluminescence display (OELD) panels and thin film transistor liquid crystal display (TFT-LCD) panels, and the TFT-LCD panels are the most widely applied. Generally, a TFT-LCD is mainly constructed of a pixel structure array substrate, a color filter array substrate and a display medium layer. The pixel structure array substrate includes a plurality of scan lines, a plurality of data lines and a plurality of pixel structures arranged in an array. Each of the pixel structures is electrically connected with the corresponding scan line and data line.

For a display panel with high definition (determined by the unit: pixel per inch, PPI), a process for fabricating the pixel structure array substrate includes performing several times of lithography and etching processes. In the ordinary fabrication technique, the gate electrodes and the scan lines are formed by utilizing a first conductive layer; the source electrodes, the drain electrodes and the data lines are formed by utilizing a second conductive layer; and the pixel electrodes are formed by utilizing a third conductive layer. When the third and the second conductive layers are disposed on the same plane, a coupling effect produced by the pixel electrodes and the structures which are formed by utilizing the second conductive layer, such as the data lines, influences reliability of the pixel structures. When the two components are too close to each other, a short-circuit problem easily occurs if any conductive object falls therebetween. Whatever the case, the operation of the display panel will be affected.

SUMMARY

The present invention provides a pixel structure with good reliability.

The present invention provides a display panel which includes the pixel structure and thus, has good reliability and display quality.

The present invention provides a method for fabricating a pixel structure, by which a pixel structure with good reliability can be fabricated.

A pixel structure of the present invention is disposed on a substrate. The pixel structure includes a gate electrode, a first gate insulation layer, a pixel electrode, a second gate insulation layer, a channel layer, a source electrode, a drain electrode and a common electrode. The gate electrode is disposed on the substrate. The first gate insulation layer is disposed on the substrate and covers the gate electrode. The pixel electrode is disposed on the first gate insulation layer. The second gate insulation layer is disposed on the substrate and covers the pixel electrode. The pixel electrode is located between the first gate insulation layer and the second gate insulation layer. The second gate insulation layer has a first contact opening which exposes a portion of the pixel electrode. The channel layer is disposed on the second gate insulation layer and located above the gate electrode. The source electrode and the drain electrode are disposed on the second gate insulation layer, respectively located at two sides of the channel layer and simultaneously contact the channel layer. The drain electrode is electrically connected with the pixel electrode. The common electrode is disposed on the second gate insulation layer, overlaps the pixel electrode and has a plurality of slits above the pixel electrode.

A display panel of the present invention includes a first substrate, a second substrate, a display medium and a plurality of pixel structures. Each of the pixel structures includes a gate electrode, a first gate insulation layer, a pixel electrode, a second gate insulation layer, a channel layer, a source electrode, a drain electrode and a common electrode. The gate electrode is disposed on the substrate. The first gate insulation layer is disposed on the substrate and covers the gate electrode. The pixel electrode is disposed on the first gate insulation layer. The second gate insulation layer is disposed on the substrate and covers the pixel electrode. The pixel electrode is located between the first gate insulation layer and the second gate insulation layer. The second gate insulation layer has a first contact opening which exposes a portion of the pixel electrode. The channel layer is disposed on the second gate insulation layer and located above the gate electrode. The source electrode and the drain electrode are disposed on the second gate insulation layer, respectively located at two sides of the channel layer and simultaneously contact the channel layer. The drain electrode is electrically connected with the pixel electrode. The common electrode is disposed on the second gate insulation layer, overlaps the pixel electrode and has a plurality of slits located above the pixel electrode.

A method of the present invention for fabricating a pixel structure includes steps as follows. A gate electrode is formed on a substrate. A first gate insulation layer is formed on the substrate and covers the gate electrode. A pixel electrode is formed on the first gate insulation layer. A second gate insulation layer covering the pixel electrode is formed, wherein the pixel electrode is located between the first gate insulation layer and the second gate insulation layer. A first contact opening is formed in the second gate insulation layer to expose a portion of the pixel electrode. A channel layer is formed on the second gate insulation layer and located above the gate electrode. A source electrode and a drain electrode are formed on the second gate insulation layer, wherein the source electrode and the drain electrode are respectively located at two sides of the channel layer and simultaneously contact the channel layer. The pixel electrode is electrically connected with the drain electrode. A common electrode is formed on the second gate insulation layer. The common electrode overlaps the pixel electrode and has a plurality of slits above the pixel electrode.

In an embodiment of the present invention, the drain electrode extends into the first contact opening to contact the portion of the pixel electrode exposed by the first contact opening.

In an embodiment of the present invention, the pixel structure further includes a protection layer disposed between the second gate insulation layer and the common electrode and the protection layer covering the second gate insulation layer, the channel layer, the source electrode and the drain electrode.

In an embodiment of the present invention, the pixel structure further includes a connection electrode disposed on the protection layer, and the protection layer has a second contact opening which exposes the drain electrode. The connection electrode is simultaneously located in the first contact opening and the second contact opening to electrically connect the pixel electrode with the drain electrode.

In an embodiment of the present invention, the connection electrode and the common electrode are in the same layer and separated from each other.

In an embodiment of the present invention, the pixel structure further includes a data line. The source electrode and the data line are connected with each other and in the same layer.

In an embodiment of the present invention, a first edge of the pixel electrode is approximately aligned with an edge of the data line.

In an embodiment of the present invention, the pixel structure further includes a scan line. The gate electrode and the scan line are connected with each other and in the same layer.

In an embodiment of the present invention, a second edge of the pixel electrode is approximately aligned with an edge of the scan line.

In an embodiment of the present invention, the method for fabricating the pixel structure further includes forming a protection layer to cover the source electrode and the drain electrode before the step of forming the common electrode on the second gate insulation layer.

In an embodiment of the present invention, the step of electrically connecting the pixel electrode with the drain electrode in the method for fabricating the pixel structure further includes extending the drain electrode into the first contact opening to electrically connect the pixel electrode.

In an embodiment of the present invention, the step of electrically connecting the pixel electrode with the drain electrode in the method for fabricating the pixel structure further includes forming a second contact opening which exposes the drain electrode in the protection layer and forming a connection electrode on the protection layer, wherein the connection electrode is simultaneously located in the first contact opening and the second contact opening to electrically connect the pixel electrode with the drain electrode.

In an embodiment of the present invention, the connection electrode and the common electrode are simultaneously formed and separated from each other in the method for fabricating the pixel structure.

In an embodiment of the present invention, a data line is further formed while forming the source electrode and the drain electrode, and the source electrode is connected with the data line in the method for fabricating the pixel structure.

In an embodiment of the present invention, the step of forming the data line in the method for fabricating the pixel structure further includes approximately aligning a first edge of the pixel electrode with an edge of the data line.

In an embodiment of the present invention, a scan line is further formed while forming the gate electrode, and the gate electrode is connected with the scan line in the method for fabricating the pixel structure.

In an embodiment of the present invention, the step of forming the pixel electrode in the method for fabricating the pixel structure further includes approximately aligning a second edge of the pixel electrode with an edge of the scan line.

In an embodiment of the present invention, a peripheral circuit pad is formed while forming the gate electrode, and the peripheral circuit pad is located in the periphery of the substrate in the method for fabricating the pixel structure.

In an embodiment of the present invention, while forming the first contact opening, at least one periphery contact opening is formed in the both the first gate insulation layer and the second gate insulation layer, wherein the least one periphery contact opening exposes the peripheral circuit pad.

To sum up, in the pixel structure of the present invention, multiple gate insulation layers between the gate electrode and the cannel are the first gate insulation layer and the second gate insulation layer, respectively. The pixel electrode is located between the first gate insulation layer and the second gate insulation layer, and the second gate insulation layer covers most of the area of the pixel electrode. Thereby, the pixel electrode is isolated from other conductive layers to avoid the sort-circuit phenomenon resulted from a conductive object falling between the pixel electrode and other conductive layers. Meanwhile, when applying the pixel structure of the embodiment of the present invention in the display panel, the display panel can have good reliability and display quality. Moreover, by utilizing the method for fabricating the pixel structure of the present invention, the pixel structure with good reliability can be fabricated.

In order to make the aforementioned and other features and advantages of the present invention more comprehensible, several embodiments accompanied with figures are described in detail below.

BRIEF DESCRIPTION OF THE DRAWINGS

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

DESCRIPTION OF EMBODIMENTS

Figure 1:
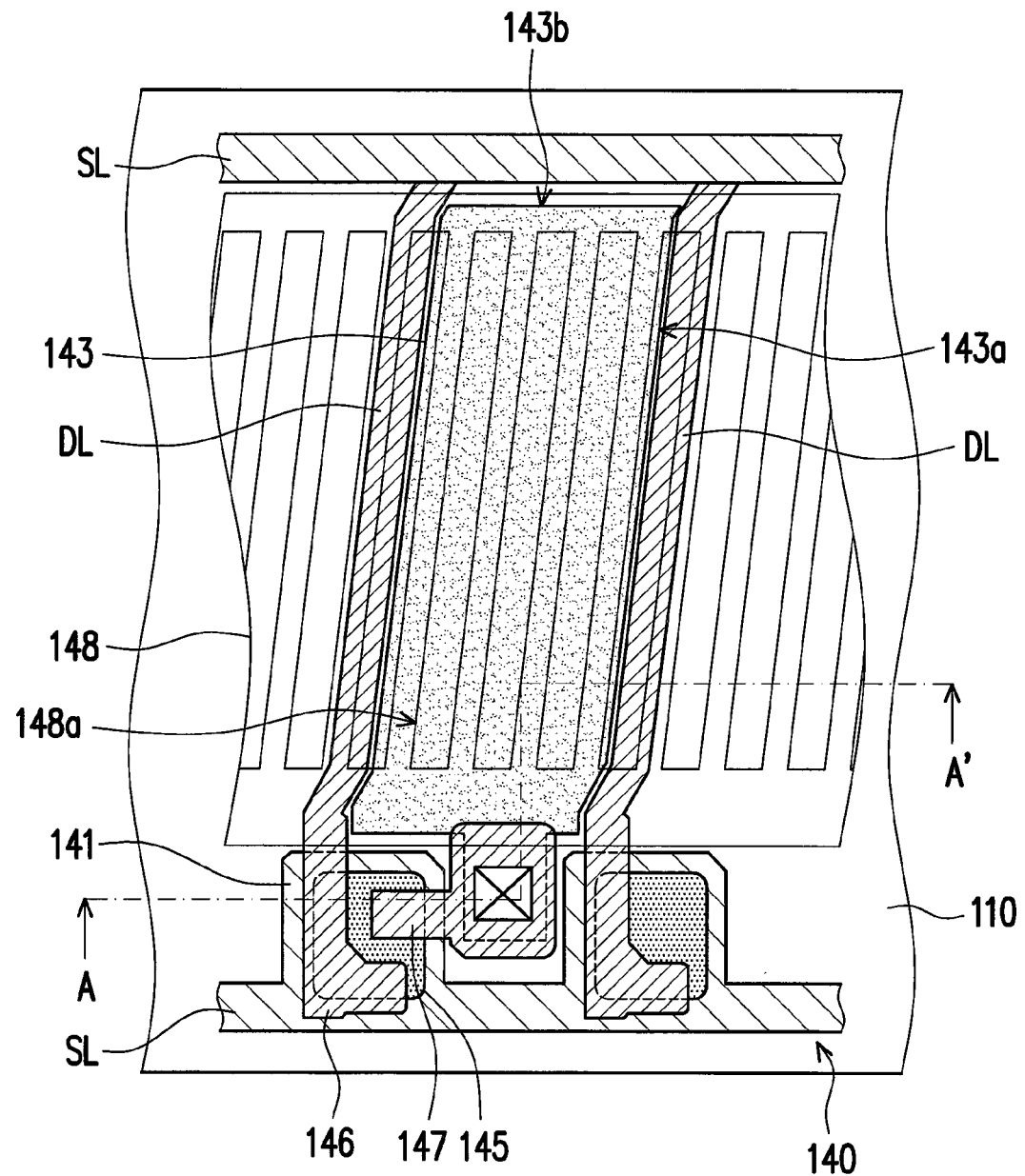
FIG. 1 is a schematic top diagram illustrating a pixel structure according to an embodiment of the present invention.
Figure 2:
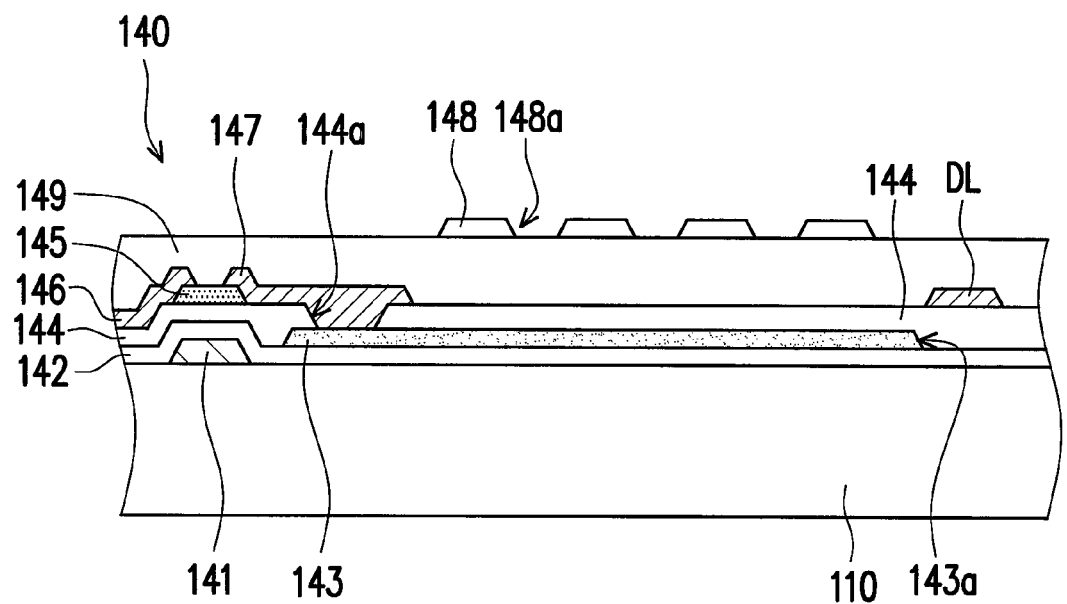
FIG. 2 is a schematic cross-sectional diagram along a line A-A' in FIG. 1.

FIG. 1 is a schematic top diagram illustrating a pixel structure according to an embodiment of the present invention. FIG. 2 is a schematic cross-sectional diagram along a line A-A' in FIG. 1. Referring to both FIG. 1 and FIG. 2, a pixel structure 140 is disposed on a first substrate 110. The pixel structure 140 includes a gate electrode 141, a first gate insulation layer 142, a pixel electrode 143, a second gate insulation layer 144, a channel layer 145, a source electrode 146, a drain electrode 147 and a common electrode 148. The gate electrode 141 is disposed on the first substrate 110. The first gate insulation layer 142 is disposed on the first substrate 110 and covers the gate electrode 141. The pixel electrode 143 is disposed on the first gate insulation layer 142. The second gate insulation layer 144 is disposed on the first substrate 110 and covers the pixel electrode 143. The pixel electrode 143 is located between the first gate insulation layer 142 and the second gate insulation layer 144. The second gate insulation layer 144 has a first contact opening 144a which exposes a portion of the pixel electrode 143.

The channel layer 145 is disposed on the second gate insulation layer 144 and located above the gate electrode 141. The source electrode 146 and the drain electrode 147 are disposed on the second gate insulation layer 144, respectively located at two sides of the channel layer 145 and simultaneously contact the channel layer 145. The drain electrode 147 is electrically connected with the pixel electrode 143. The common electrode 148 is disposed on the second gate insulation layer 144, overlaps the pixel electrode 143 and has a plurality of slits 148a, wherein the slits 148a are located the pixel electrode 143.

In the present embodiment, the gate insulation layer covering the gate electrode 141 and located between the gate electrode 141 and the channel layer 145 is divided into the first gate insulation layer 142 and the second gate insulation layer 144. The pixel electrode 143 is located between the first gate insulation layer 142 and the second gate insulation layer 144, and the second gate insulation layer 144 covers most of the area of the pixel electrode 143. When fabricating other conductive layers, the second gate insulation layer 144 may be utilized to isolate the pixel electrode 143 from said other conductive layers. For instance, by fabricating the conductive layer on the second gate insulation layer 144, the pixel electrode 143 is not co-planar with said other conductive layers. By doing so, a short-circuit phenomenon resulted from a conductive object falling between the pixel electrode and said other conductive layers may be prevented.

Here, it is to be mentioned that the pixel structure 140 of the present embodiment includes the pixel electrode 143 and the common electrode 148 having the slits 148a, and the common electrode 148 overlaps the pixel electrode 143. Thus, the pixel structure 140 of the present embodiment may be applied to a fringe field switching (FFS) display panel which has an advantage of wide viewing angle.

In the present embodiment, the drain electrode 147 extends into first contact opening 144a to contact the portion of the pixel electrode 143 exposed by the first contact opening 144a, such that the drain electrode 147 is electrically connected with the pixel electrode 143. As illustrated in FIG. 2, the pixel structure 140 of the present embodiment may selectively also includes a protection layer 149 disposed between the second gate insulation layer 144 and the common electrode 148. The protection layer 149 covers the second gate insulation layer 144, the channel layer 145, the source electrode 146 and the drain electrode 147. The protection layer 149 protects the channel layer 145, the source electrode 146 and the drain electrode 147 thereunder from being oxidized.

Additionally, the pixel structure 140 further includes a data line DL and a scan line SL. The source electrode 146 and the data line DL are connected with each other and in the same layer. The gate electrode 141 and the scan line SL are connected with each other and in the same layer. Meanwhile, a first edge 143a of the pixel electrode 143 is approximately aligned with an edge of the data line DL, and a second edge 143b of the pixel electrode 143 is approximately aligned with an edge of the scan line SL. In the present embodiment, the second gate insulation layer 144 is disposed between the layer where the source electrode 146 and the data line DL are located and the pixel electrode 143, such that the first edge 143a of the pixel electrode 143 may approach the data line DL without short-circuiting between each other. Likewise, the first gate insulation layer 142 is disposed between the layer where the gate electrode 141 and the scan line SL are located, such that the second edge 143b of the pixel electrode 143 may approach the scan line SL without short-circuiting between each other. Such design may dramatically reduced a distance between the pixel electrode 143 and the scan line SL and a distance between the pixel electrode 143 and the data line DL that is adjacent thereto, and thus, an available area of the pixel electrode 143 may be significantly increased. For a high resolution product, a display aperture ratio of the pixel structure 140 is improved and a yield of product fabrication may be accordingly improved under a requirement that the pixel electrode 143 has a limited available space.

That is to say, with the first gate insulation layer 142 and the second gate insulation layer 144, the pixel electrode 143 is not co-planar with other conductive layers in the pixel structure 140, such as the layer where the source electrode 146 and data line DL are located and the layer where the drain electrode 147 and the scan line SL are located. Thus, the first edge 143a and the second edge 143b of the pixel electrode 143 may be disposed closer to the data line DL and the scan line SL, even to overlap the data line DL and the scan line SL. Thereby, the area of the pixel electrode 143 may be increased to facilitate in enhancing the display aperture ratio of the pixel structure 140. In other embodiments, even though a process variation results in a displacement of the pixel electrode 143 relative to the scan line SL and the data line DL, which are located in different layers, the area of the pixel electrode 143 may even overlap the area of the data line DL or the area of the scan line SL, a short-circuit problem would not occur between the pixel electrode 143 and the data line DL or between the pixel electrode 143 and the scan line SL.

The layer disposition and function of the pixel structure 140 of the present embodiment have been described in the above, and a method for fabricating the pixel structure 140 will be described with reference to the drawing as follows. Referring to FIG. 1 and FIG. 2, the gate electrode 141 is first formed on the first substrate 110. Then, the first gate insulation layer 142 is formed on the first substrate 110 and covers the gate electrode 141. Thereafter, the pixel electrode 143 is formed on the first gate insulation layer 142. A material of the pixel electrode 143 may be indium tin oxide (ITO), indium zinc oxide (IZO), aluminum zinc oxide (AZO), indium gallium zinc oxide (IGZO) or any other conductive material. Here, when the material of the pixel electrode 143 is a transparent conductive material, the pixel structure 140 is a transmissive pixel structure, and when the material of the pixel electrode 143 is a metal or a metal alloy, the pixel structure 143 is a reflective pixel structure. Afterward, the second gate insulation layer 144 is formed and covers the pixel electrode 143, such that the pixel electrode 143 is located between the first gate insulation layer 142 and the second gate insulation layer 144. As illustrated in FIG. 2, the second gate insulation layer 144 overlaps the first gate insulation layer 142, and both cover the gate electrode 141. In the present embodiment, a material of the first gate insulation layer 142 may be silicon oxide, silicon nitride or silicon oxynitride, which constructs no limitation to the present invention. Any ordinary material for the gate insulation layer may applicable. The second gate insulation layer 144 and the first gate insulation layer 142 may be fabricated of the same material or different materials.

Next, the first contact opening 144a is formed in the second gate insulation layer 144 to expose a portion of the pixel electrode 143, and a channel layer 145 is formed on the second gate insulation layer 144. A material of the channel layer 145 of the present embodiment may be a silicon semiconductor or an oxide semiconductor. The silicon semiconductor may be, for example, amorphous silicon, polycrystalline silicon or silicon epitaxy, and the oxide semiconductor may be, for example, IGZO or IZO, but the present invention is not limited thereto. The channel layer 145 is located above the gate electrode 141. As illustrated in FIG. 2, after the channel layer 145 is formed, the source electrode 146 and the drain electrode 147 are formed on the second gate insulation layer 144. Therein, the source electrode 146 and the drain electrode 147 are respectively located at two sides of the channel layer 145 and simultaneously contact the channel layer 145. The protection layer 149 is then formed to cover the source electrode 146 and the drain electrode 147. In the present embodiment, a material of the protection layer 149 may be silicon oxide, silicon nitride, or an organic material.

After being formed, the protection layer 149 electrically connects the pixel electrode 143 with the drain electrode 147. It is to be mentioned that in the present embodiment, the drain electrode 147 is extended into the first contact opening 144a to electrically connect with the pixel electrode 143. Finally, the common electrode 148 is formed on the protection layer 149, overlaps the pixel electrode 143 and has a plurality of slits 148a above the pixel electrode 143. In another embodiment, the protection layer 149 may selectively omitted and replaced by the second gate insulation layer 144 to separate the pixel electrode 143 from the common electrode 148. Thus, the common electrode 148 may be selectively disposed on the second gate insulation layer 144.

In the present embodiment, the data line DL, the source electrode 146 and the drain electrode 147 are formed simultaneously, and the source electrode 146 is connected with the data line DL. Meanwhile, the scan line SL and the gate electrode 141 are formed simultaneously, and the gate electrode 141 is connected with the scan line SL. In addition, with the disposition of the first gate insulation layer 142 and the second gate insulation layer 144, the edge of the data line DL may be approximately aligned with the first edge 143a of the pixel electrode 143 when forming the data line DL, and the second edge 143b of the pixel electrode 143 may be approximately aligned with or separated with a quite narrow gap from the edge of the scan line SL when forming the pixel electrode 143. By doing so, the pixel electrode 143 may be disposed to have an increased area without contacting the data line DL or the scan line SL easily. Hence, the pixel structure 140 has an optimal aperture ratio with good quality and reliability.

In the embodiments described below, element labels and portions of the previous embodiments are referenced hereafter, and the same or similar elements are indicated by the same or similar reference labels. The descriptions of the same technical details are therefore not repeated here. The parts omitted from description may be referenced from the afore-described embodiments and are not repeated in the embodiments below.

Figure 3:
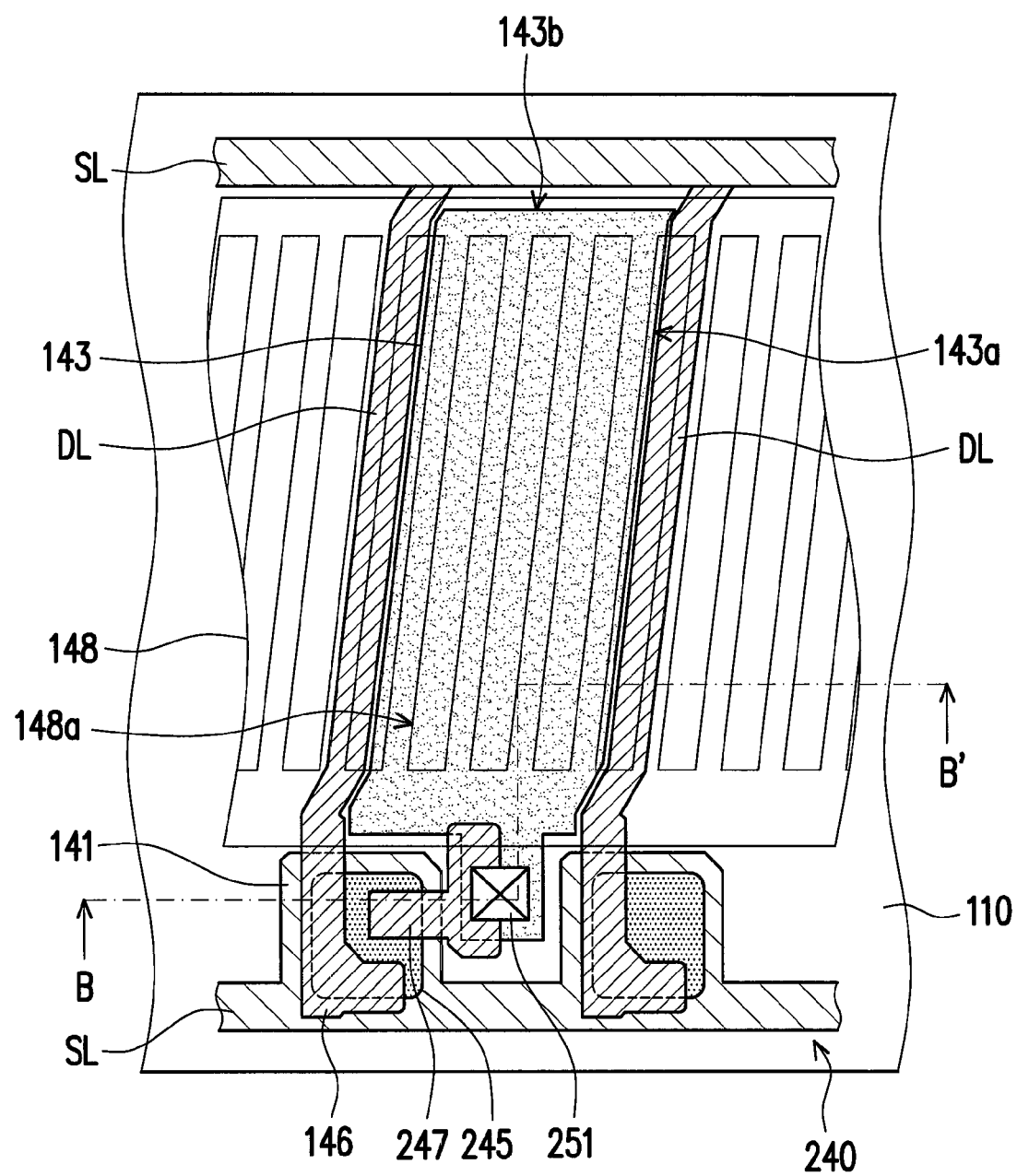
FIG. 3 is a schematic top diagram illustrating a pixel structure according to another embodiment of the present invention.
Figure 4:
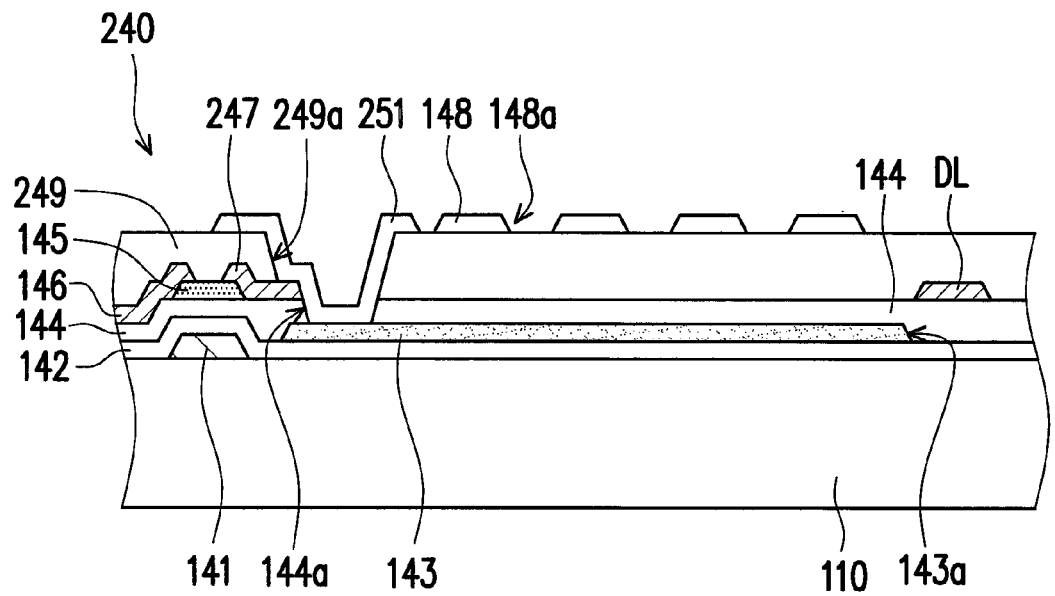
FIG. 4 is a schematic cross-sectional diagram along a line B-B' in FIG. 3.

FIG. 3 is a schematic top diagram illustrating a pixel structure according to another embodiment of the present invention. FIG. 4 is a schematic cross-sectional diagram along a line B-B' in FIG. 3. Referring to both FIG. 3 and FIG. 4, a pixel structure 240 of the present embodiment is similar to the pixel structure 140 illustrated in FIG. 1, and a major difference therebetween lies in the way of the drain electrode electrically connected with the pixel electrode. In the present embodiment, the pixel structure 240 further includes a connection electrode 251 disposed on a protection layer 249, and the protection layer 249 has a second contact opening 249a which exposes a drain electrode 247. The connection electrode 251 is located in both the first contact opening 144a and the second contact opening 249a simultaneously to electrically connect the pixel electrode 143 with the drain electrode 247. That is to say, the drain electrode 247 of the present embodiment does not extend into the first contact opening 144a to connect the pixel electrode 143 directly, but electrically connect the pixel electrode 143 via the connection electrode 251. Moreover, the connection electrode 251 and the common electrode 148 of the present embodiment are in the same layer and separated from each other, so as to prevent the connection electrode 251 and the common electrode 148 from a coupling effect.

A method for fabricating for the pixel structure 240 of the present embodiment is similar to the embodiment illustrated in FIG. 1, a major difference therebetween lies in the method for electrically connecting the pixel electrode with the drain electrode. Referring to FIG. 3 and FIG. 4, in the present embodiment, after forming the protection layer 249, the second contact opening 249a which exposes the drain electrode 247 is first formed in the protection layer 249. In this case, the second contact opening 249a and the first contact opening 144a are, for example, connected with each other. However, the second contact opening 249a has a size larger than that of the first contact opening 144a so as to expose the drain electrode 247. Then, the connection electrode 251 is formed on the protection layer 249, such that the connection electrode 251 is located in both the first contact opening 144a and the second contact opening 249a simultaneously to electrically connect the pixel electrode 143 with the drain electrode 247. In the present embodiment, the connection electrode 251 and the common electrode 148 are simultaneously formed and separated from each other.

Figure 5:
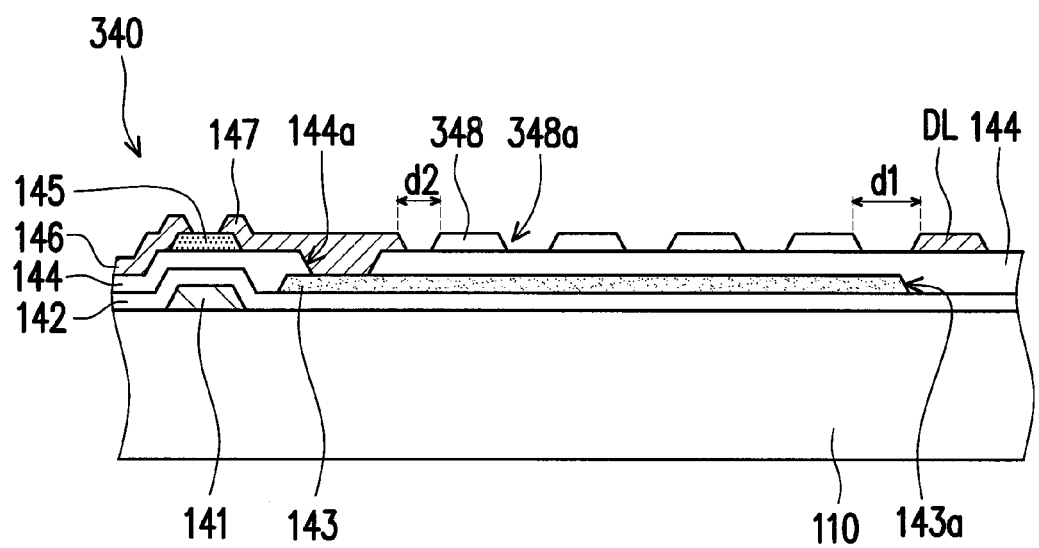
FIG. 5 is a schematic cross-section diagram illustrating a pixel structure according to still another embodiment of the present invention.

FIG. 5 is a schematic cross-section diagram illustrating a pixel structure according to still another embodiment of the present invention. A pixel structure 340 of the embodiment illustrated in FIG. 5 is similar to the embodiment illustrated in FIG. 1, and a major difference therebetween lies in that the pixel structure 340 of the embodiment illustrated in FIG. 5 does not include a protection layer, and a common electrode 348 is fabricated on the second gate insulation layer 144. It is to be mentioned that in the present embodiment, a distance d1 may be between the common electrode 348 and the data line DL, and the distance d1 ranges, for example, from 1.2 µm to 3 µm. By doing so, electrical connection or short circuit between the common electrode 348 and the data line DL may be prevented. Likewise, a distance d2 may be between the common electrode 348 and the drain electrode 147, and the distance d2 ranges, for example, from 1.2 µm to 3 µm. By doing so, electrical connection or short circuit between the common electrode 348 and the drain electrode 147 may be prevented.

Figure 6:
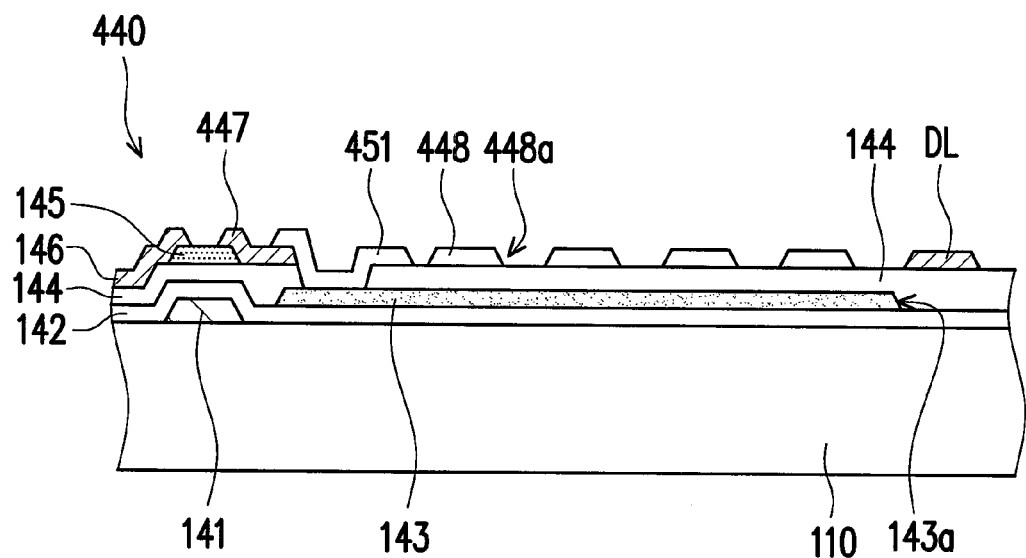
FIG. 6 is a schematic cross-section diagram illustrating a pixel structure according to yet another embodiment of the present invention.

FIG. 6 is a schematic cross-section diagram illustrating a pixel structure according to yet another embodiment of the present invention. A pixel structure 440 of the present embodiment illustrated in FIG. 6 is similar to the embodiment illustrated in FIG. 3, and a major difference therebetween lies in that the pixel structure 440 illustrated in FIG. 6 does not include a protection layer, and a common electrode 448 is fabricated on the second gate insulation layer 144. Technical description related to this part may be referred to the preceding embodiment, and will not be repeated hereinafter.

Figure 7:
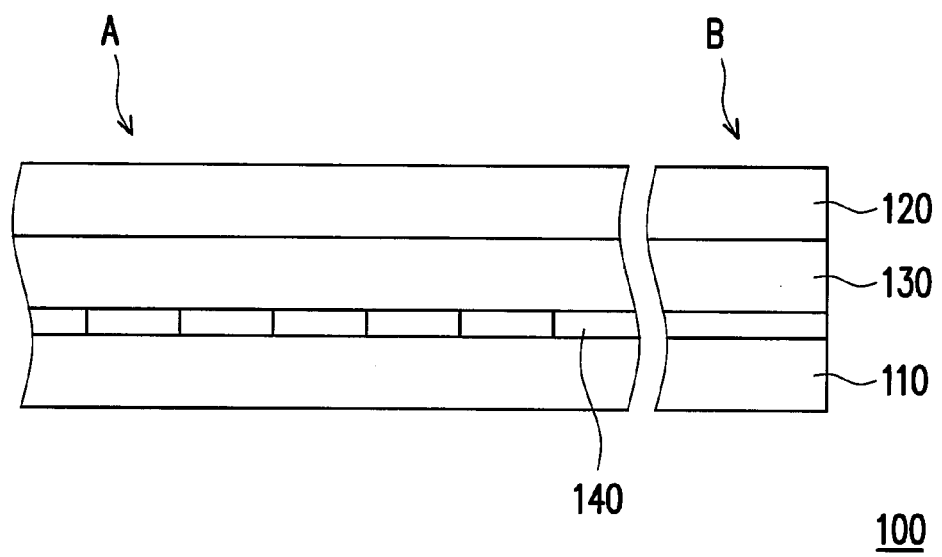
FIG. 7 is a schematic cross-sectional diagram illustrating a display panel according to an embodiment of the present invention.
Figure 8:
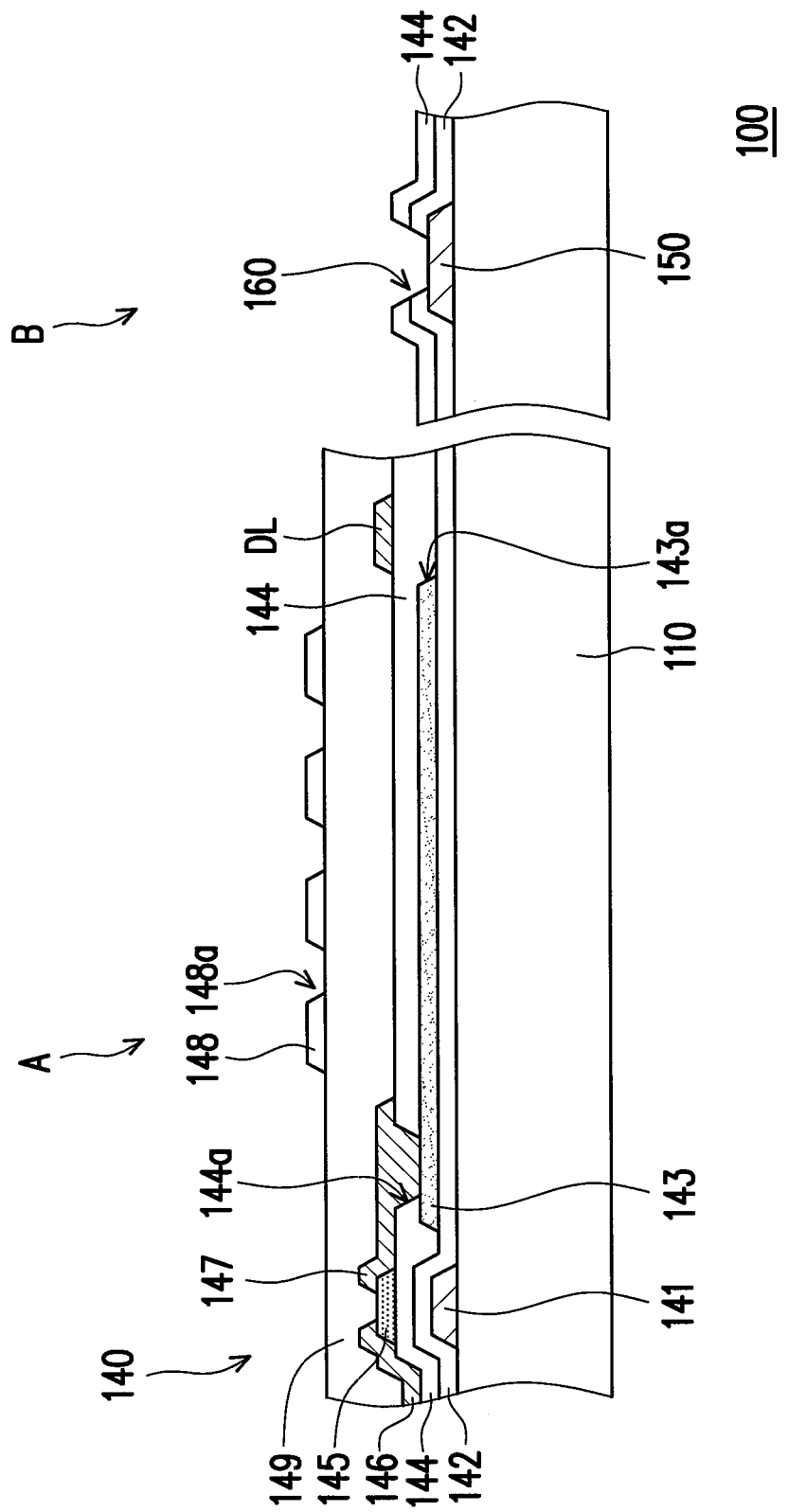
FIG. 8 is a partially enlarged diagram illustrating the display panel depicted in FIG. 7.

FIG. 7 is a schematic cross-sectional diagram illustrating a display panel according to an embodiment of the present invention. FIG. 8 is a partially enlarged diagram illustrating the display panel depicted in FIG. 7. A display panel 100 includes a first substrate 110, a second substrate 120, a display medium 130 and a plurality of pixel structures 140. The second substrate 120 overlaps the first substrate 110. The display medium 130 is disposed between the first substrate 110 and the second substrate 120. The pixel structures 140 are disposed on the first substrate 110 and arranged in an array. The pixel structures 140 are located between the first substrate 110 and the display medium 130. It is to be mentioned that the pixel structures 140 of the present embodiment are the pixel structure 140 illustrated in FIG. 1. That is to say, the pixel structure 140 illustrated in FIG. 1 is applied in the display panel 100 of the present embodiment. In the present embodiment, the display medium 130 may be a liquid crystal layer, and the second substrate 120 may be a color filter substrate.

It should be noted that the display panel 100 may be divided into a display region A and a peripheral region B. The pixel structures 140 are disposed in the display region A, and a plurality of peripheral circuits (not shown) is configured in the peripheral region B. The peripheral circuits require to be electrically connected with a peripheral circuit pad 150 for signal transmission. As illustrated in FIG. 8, the peripheral circuit pad 150 is located in the periphery of the first substrate 110, i.e., the peripheral region B. In the present embodiment, the peripheral circuit pad 150 may be formed while forming the gate electrode 141, and a periphery contact opening 160 may be formed in the first gate insulation layer 142 and the second gate insulation layer 144 while forming the first contact opening 144a, such that the periphery contact opening 160 may expose the peripheral circuit pad 150. By doing so, the peripheral circuit pad 150 may be exposed from the periphery contact opening 160 and connected with other circuit elements.

In the present embodiment, the first contact opening 144a and the periphery contact opening 160 are formed simultaneously. That is to say, when the pixel structure 140 is applied in the display panel 100, the first contact opening 144a and the periphery contact opening 160 serving to expose the pixel electrode 143 are formed simultaneously. Such fabrication method allows the first contact opening 144a to be formed while fabricating the pixel structure 140 without an additional process. In stead, the first contact opening 144a and the periphery contact opening 160 are fabricated in the same process. Thus, the fabrication steps can be simplified, and the cost can be saved. Moreover, while fabricating the common electrode 148, a transparent conductive material may be filled in the periphery contact opening 160 to cover the peripheral circuit pad 150 (not shown) to improve contact stability of the peripheral circuit pad 150 and avoid poor contact resulted from metal oxidation.

Additionally, in the present embodiment, the pixel structure 140 of FIG. 1 is illustrated as the pixel structure 140 applied to the display panel 100 for example. However, the pixel structures 240, 340 and 440 in the aforementioned embodiments may be likewise applied to the display panel 100. Furthermore, in the fabrication method, the first contact opening 144a and the periphery contact opening 160 can also be fabricated simultaneously so as to simplify the steps and save the cost.

Based on the above, in the pixel structure of the present invention, the gate insulation layer covering the gate electrode and located between the gate electrode and the channel layer is divided to the first gate insulation layer and the second gate insulation layer. Therein, the pixel electrode is located between the first gate insulation layer and the second gate insulation layer and covered by the second gate insulation layer. By doing so, the pixel electrode may be isolated from other conductive layers to prevent a conductive object from falling therebetween. For instance, by fabricating the data line which is located in the same layer as the source electrode on the second gate insulation layer, the pixel electrode may be isolated from the data line to prevent a short-circuit problem therebetween. Thus, the area of the pixel electrode may be increased, such that the first edge of the pixel electrode approaches to and is approximately aligned with the data line. Moreover, when applying the pixel structure of the present invention to the display panel with high resolution, the display panel can have a high aperture ratio, good reliability and display quality.

By utilizing the method for fabricating the pixel structure of the present invention, the aforementioned pixel structure with good reliability may be produced. Moreover, the first contact opening of the pixel structure and the periphery contact opening of the display panel may be fabricated in the same fabrication process so as to simplify the steps and save the cost.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A pixel structure, disposed on a substrate and comprising:
   a gate electrode, disposed on the substrate;
   a first gate insulation layer, disposed on the substrate and covering the gate electrode;
   a pixel electrode, disposed on the first gate insulation layer;
   a second gate insulation layer, disposed on the substrate and covering the pixel electrode, wherein the pixel electrode is located between the first gate insulation layer and the second gate insulation layer, and the second gate insulation layer has a first contact opening which exposes a portion of the pixel electrode;
   a channel layer, disposed on the second gate insulation layer and located above the gate electrode;
   a data line disposed on the second gate insulation layer;
   a source electrode and a drain electrode, disposed on the second gate insulation layer, respectively located at two sides of the channel layer and simultaneously contacting the channel layer, wherein the drain electrode is electrically connected with the pixel electrode via the first contact opening of the second gate insulation layer, and wherein the source electrode and the data line are connected with each other; and
   a common electrode, disposed on the second gate insulation layer, overlapping the pixel electrode and having a plurality of slits locating above the pixel electrode.

2. The pixel structure according to claim 1, further comprising a protection layer, disposed between the second gate insulation layer and the common electrode and covering the second gate insulation layer, the channel layer, the source electrode and the drain electrode.

3. The pixel structure according to claim 2, further comprising a connection electrode, disposed on the protection layer, having a second contact opening which exposes the drain electrode and simultaneously located in the first contact opening and the second contact opening so as to electrically connect the pixel electrode with the drain electrode.

4. The pixel structure according to claim 3, wherein the connection electrode and the common electrode are in the same layer and separated from each other.

5. The pixel structure according to claim 1, wherein the source electrode and the data line are in the same layer.

6. The pixel structure according to claim 5, wherein an edge of the pixel electrode is approximately aligned with an edge of the data line.

7. The pixel structure according to claim 1, further comprising a scan line, wherein the gate electrode and the scan line are connected with each other and in the same layer.

8. The pixel structure according to claim 7, wherein an edge of the pixel electrode is approximately aligned with an edge of the scan line.

9. A display panel, comprising:
a first substrate;
a second substrate, overlapping the first substrate;
a display medium, disposed between the first substrate and the second substrate; and
a plurality of pixel structures, disposed on the first substrate, located between the first substrate and the display medium, wherein each of the pixel structures comprises:
a gate electrode, disposed on the substrate;
a first gate insulation layer, disposed on the substrate and covering the gate electrode;
a pixel electrode, disposed on the first gate insulation layer;
a second gate insulation layer, disposed on the substrate and covering the pixel electrode, wherein the pixel electrode is located between the first gate insulation layer and the second gate insulation layer, and the second gate insulation layer has a first contact opening which exposes a portion of the pixel electrode;
a channel layer, disposed on the second gate insulation layer and located above the gate electrode;
a data line disposed on the second gate insulation layer;
a source electrode and a drain electrode, disposed on the second gate insulation layer, respectively located at two sides of the channel layer and simultaneously contacting the channel layer, wherein the drain electrode is electrically connected with the pixel electrode via the first contact opening of the second gate insulation layer, and wherein the source electrode and the data line are connected with each other; and
a common electrode, disposed on the second gate insulation layer, overlapping the pixel electrode and having a plurality of slits locating above the pixel electrode.

10. A method for fabricating a pixel structure, comprising:
forming a gate electrode on a substrate;
forming a first gate insulation layer on the substrate, wherein the first gate insulation layer covers the gate electrode;
forming a pixel electrode on the first gate insulation layer;
forming a second gate insulation layer on the substrate, the second gate insulation layer covers the pixel electrode, wherein the pixel electrode is located between the first gate insulation layer and the second gate insulation layer;
forming a first contact opening in the second gate insulation layer to expose a portion of the pixel electrode;
forming a channel layer on the second gate insulation layer, wherein the channel layer is located above the gate electrode;
forming a data line, a source electrode, and a drain electrode on the second gate insulation layer, wherein the source electrode and the drain electrode are respectively located at two side of the channel layer and simultaneously contact the channel layer, wherein the source electrode and the data line are connected with each other;
electrically connecting the pixel electrode with the drain electrode via the first contact opening of the second gate insulation layer; and
forming a common electrode on the second gate insulation layer, wherein the common electrode overlaps the pixel electrode and has a plurality of slits located above the pixel electrode.

11. The method according to claim 10, further comprising:
forming a protection layer to cover the source electrode and the drain electrode before forming the common electrode on the second gate insulation layer.

12. The method according to claim 10, wherein the step of electrically connecting the pixel electrode with the drain electrode comprises:
extending the drain electrode into the first contact opening to electrically connect the portion of the pixel electrode.

13. The method according to claim 10, wherein the step of electrically connecting the pixel electrode with the drain electrode comprises:
forming a second contact opening which exposes the drain electrode in the protection layer; and
forming a connection electrode on the protection layer, wherein the connection electrode is simultaneously located in the first contact opening and the second contact opening to electrically connect the pixel electrode with the drain electrode.

14. The method according to claim 13, wherein the connection electrode and the common electrode are simultaneously formed and separated from each other.

15. The method according to claim 10, wherein the data line, the source electrode and the drain electrode are formed simultaneously.

16. The method according to claim 15, wherein the step of forming the data line comprises:
approximately aligning an edge of the pixel electrode with an edge of the data line.

17. The method according to claim 10, wherein further comprises forming a scan line while forming the gate electrode, and the gate electrode is connected with the scan line.

18. The method according to claim 17, wherein the step of forming the pixel electrode comprises:
approximately aligning an edge of the pixel electrode with an edge of the scan line.

19. The method according to claim 10, wherein a peripheral circuit pad is formed while forming the gate electrode, and the peripheral circuit pad is located in the periphery of the substrate.

20. The method according to claim 19, wherein while forming the first contact opening, at least one periphery contact opening is formed in the both the first gate insulation layer and the second gate insulation layer, wherein the least one periphery contact opening exposes the peripheral circuit pad.

* * * * *